United States Patent [19]

Moon

[11] Patent Number: 5,660,696

[45] Date of Patent: Aug. 26, 1997

[54] METHOD FOR FORMING METAL LINES BY SPUTTERING

[75] Inventor: Jong Moon, Suwon, Rep. of Korea

[73] Assignee: Samsung Electronics co., Ltd., Suwon, Rep. of Korea

[21] Appl. No.: 613,388

[22] Filed: Mar. 7, 1996

Related U.S. Application Data

[62] Division of Ser. No. 449,839, May 24, 1995, Pat. No. 5,614,070.

[30] Foreign Application Priority Data

May 24, 1994 [KR] Rep. of Korea .................. 94-11274

[51] Int. Cl.⁶ ..................................... C23C 14/34
[52] U.S. Cl. ................ 438/643; 438/645; 438/649; 438/653; 438/655; 204/192.17
[58] Field of Search ............... 204/192.17; 437/192, 437/194, 200, 203

[56] References Cited

U.S. PATENT DOCUMENTS 5,427,666  6/1995  Mueller et al. .................. 204/192.17

FOREIGN PATENT DOCUMENTS

| 63-203771 | 8/1988 | Japan | 204/298.09 |
| 2-291124 | 11/1990 | Japan | 204/192.17 |
| 5-13366 | 1/1993 | Japan | 437/200 |

*Primary Examiner*—Aaron Weisstuch
*Attorney, Agent, or Firm*—William L. Geary, Jr.

[57] ABSTRACT

A method of forming metal lines such as titanium and aluminum on a semiconductor wafer by sputtering at a high temperature, preferably in the range of approximately 500° C. to 800° C. This method decreases the contact resistance between the layers while reducing the number of processing steps.

19 Claims, 4 Drawing Sheets

METHOD FOR FORMING METAL LINES BY SPUTTERING

This is a division of application Ser. No. 08/449,839, filed 24 May 1995, now U.S. Pat. No. 5,614,070.

BACKGROUND OF THE INVENTION

The present invention relates generally to a method for forming metal lines in the manufacture of a highly integrated semiconductor device, and, more particularly, to a method for forming a metal line in which a diffusion barrier layer and a metal layer are formed at a high temperature in the range of 500° C.–800° C., and a sputtering apparatus therefor.

In general, the memory capacity of semiconductor memory devices (e.g., DRAMs) has quadrupled approximately every four years. For example, 1 Mb DRAMs were in mass production approximately four years before 4 Mb DRAMs were in mass production, which were in mass production approximately four years before 16 Mb DRAMs were in mass production. At the present time, 64 Mb DRAMs are going into mass production, and 256 Mb DRAMs are still under development. As a result of this quadrennial quadrupling of memory capacity, and the commensurate increases in the integration density of such semiconductor devices, the minimum size of the geometries or features etched into the various layers of such semiconductor devices must be commensurately decreased (scaled down) in order to enable a much greater number of circuit elements, e.g., transistors, to be formed per unit of area of the device. The minimum size of the geometries or features, e.g., the channel length of the transistors, is referred to as the "design rule". For example, the minimum design rule for 1 Mb DRAMs approaches 1 μm, the minimum design rule for 4 Mb DRAMs approaches 0.8 μm, and the minimum design rule for 16 Mb DRAMs approaches 0.5 μm. As a result of this progressive shrinkage of the geometries of semiconductor devices, the linewidth of aluminum lines thereof has commensurately decreased, thereby degrading the reliability and functionality of the aluminum lines, and thus, the reliability and operating speed of the devices. For example, problems which have accompanied decreases in the minimum design rule include electromigration due to high current density, degradation of shallow junction characteristics due to Al spiking of the silicon substrate, and increased contact resistance due to smaller ohmic contacts and increased contact hole aspect ratios.

One technique that has been developed to minimize the above-stated problems is to provide a diffusion barrier layer between the aluminum lines and the base layer, e.g., the semiconductor substrate. With reference now to FIGS. 1–4, a conventional method for forming a metal line using this technique will now be described.

With particular reference now to FIG. 1, an insulation layer (e.g., an oxide layer) 12 is formed on a silicon substrate 10. A contact hole is then formed in the oxide layer 12 by a conventional photolithographic etching process, to thereby expose a portion of the substrate 10. Next, an ohmic layer, e.g., a titanium layer 14, is formed on the oxide layer 12 and the exposed portion of the substrate 10, by a sputtering method. With reference now to FIG. 8A, which depicts the portion designated "a" in FIG. 1 in greater detail, an amorphous $TiSi_x$ layer 13 is formed between the titanium layer 14 and the substrate 10 as a consequence of the formation of the titanium layer 14.

With particular reference now to FIG. 2, a diffusion barrier layer, e.g., a titanium nitride layer 16, is formed on the titanium layer 14, by a sputtering method. Subsequently, the resultant structure is annealed in a furnace under a nitrogen atmosphere, at a temperature of 400°–500° C. The portion designated "b" in FIG. 2 can be seen in greater detail in FIG. 9A.

With particular reference now to FIG. 3, a metal, e.g., aluminum, is deposited on the titanium nitride (TiN) layer 16, by a sputtering method, to thereby form a metal layer 18 on the titanium nitride layer 16.

With particular reference now to FIG. 4, the metal layer 18 is heat-treated at a high temperature below its melting point, to thereby cause the metal layer 18 to reflow and fill the contact hole, thus providing a metal line layer 19. With reference now to FIG. 10A, which depicts the portion designated "c" in FIG. 4 in greater detail, it can be seen that a TiON layer 17 is formed on the titanium nitride layer 16 as a consequence of oxidation which occurs during the annealing step.

Although the above-described conventional method for forming a metal line has achieved widespread use, it still suffers from significant drawbacks and shortcomings. First, the method is unduly complex, thereby increasing the cost and decreasing the reliability and efficiency of the semiconductor device manufacturing process. Second, because the Ti layer 14 is deposited by means of a sputtering process carried out at a low temperature of 200° C. or below, the titanium and the silicon do not fully react with each other, with the consequence that the amorphous $TiSi_x$ layer 13 is formed between the Ti layer 14 and the substrate 10, which increases contact resistance. Third, since the annealing step is carried out at ambient atmospheric pressure, the TiN layer 16 is oxidized, thereby resulting in the formation of the TiON layer 17 on the TiN layer 16, which also increases contact resistance, and, further, degrades the quality of the metal layer 18 deposited thereon.

Based on the above, it can be appreciated that there presently exists a need in the art for a method for forming metal lines and a sputtering apparatus therefor which eliminates the above-described drawbacks and shortcomings of the presently available technology. The present invention fulfills this need.

SUMMARY OF THE INVENTION

The present invention encompasses a method for forming a metal line in which titanium, titanium nitride, and aluminum layers are successively formed at a high temperature, preferably in the range of 500° C.–800° C., and preferably in the same vacuum sputtering chamber, without breaking the vacuum.

The present invention also encompasses a sputtering apparatus for facilitating this method, which includes a silicon carbide chuck and an annular reactive gas injector, which enable direct, uniform heating of a wafer supported by the chuck, and the deposition of a titanium nitride layer having a uniform thickness and composition, respectively.

BRIEF DESCRIPTION OF THE DRAWINGS

These and various other objects, features, and advantages of the present invention will be readily understood with reference to the following detailed description taken in conjunction with the accompanying drawings, in which.

DETAILED DESCRIPTION OF THE INVENTION

Figure 1:
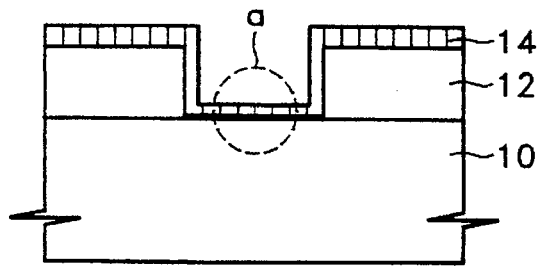
FIGS. 1–4 are cross-sectional views depicting successive steps of a conventional method for forming a metal line.
Figure 2:
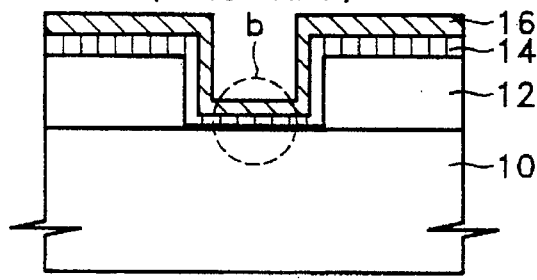
Figure 3:
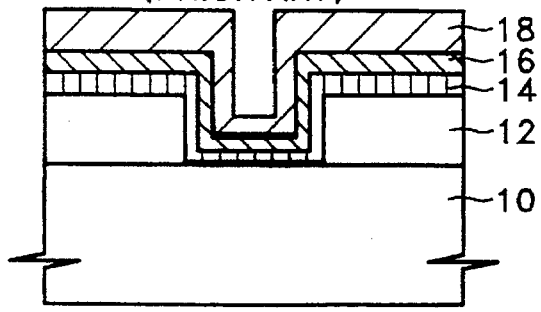
Figure 4:
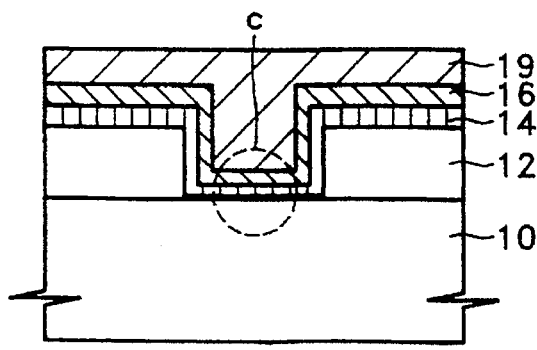
Figure 5:
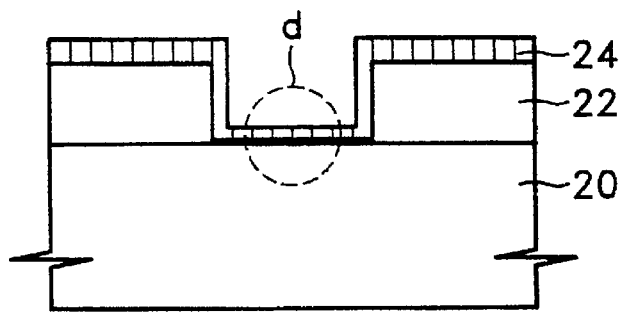
FIGS. 5–7 are cross-sectional views depicting successive steps of a method for forming a metal line in accordance with a preferred embodiment of the present invention.
Figure 6:
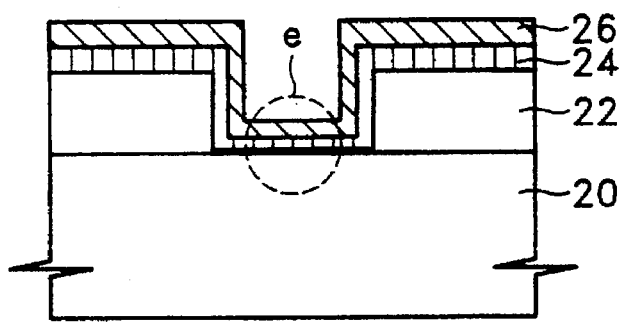
Figure 7:
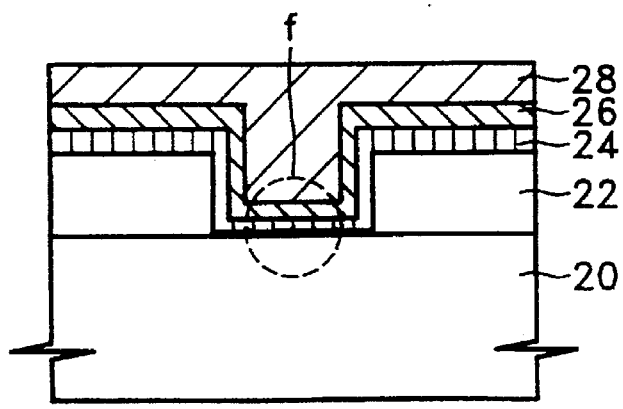

With reference now to FIGS. 5-7, a method for forming a metal line in accordance with a preferred embodiment of the present invention will now be described.

With particular reference now to FIG. 5, an insulating layer, e.g., an oxide layer 22, is formed on a silicon substrate 20. Next, a contact hole is formed in the oxide layer 22, e.g., by a standard photolithographic etching process, to thereby expose a portion of the substrate 20. Then, titanium is deposited on the oxide layer 22 and the exposed portion of the substrate 20, by means of a sputtering process carried out at a temperature in the range of 500°-800° C., and, most preferably, at a temperature of about 580° C., to thereby form a titanium (Ti) layer 24.

Figure 8A:
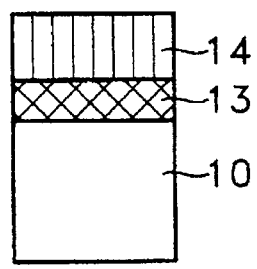
FIGS. 8A & 8B, 9A & 9B, add 10A & 10B, are magnified, cross-sectional views of respective designated portions of the structures depicted in FIGS. 1-7, for illustrating the advantages of the present invention over the presently available technology.
Figure 8B:
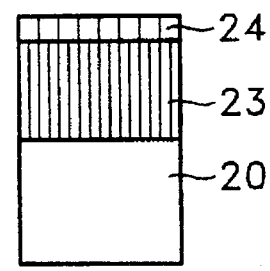

With reference now to FIG. 8B, which depicts the portion designated "d" in FIG. 5 in greater detail, a polycrystalline $TiSi_x$ layer 23 is formed between the titanium layer 24 and the substrate 20. This is in contrast to the amorphous $TiSi_x$ layer 13 formed between the titanium layer 14 and the substrate 10 (as depicted in FIG. 8A) in the conventional method for forming a metal line. The difference is due to the fact that the titanium layer is deposited at a much higher temperature with the method of the present invention, relative to the conventional method, thus facilitating a more complete reaction between the titanium and the silicon. The polycrystalline $TiSi_x$ layer 23 has a lower contact resistance than that of the amorphous $TiSi_x$ layer 13, thereby overcoming this drawback of the presently available technology.

With particular reference now to FIG. 6, a diffusion barrier layer, e.g., a titanium nitride (TIN) layer 26, is formed on the titanium layer 24, by means of a sputtering process carried out at a temperature in the range of 500°-800° C., and, preferably, at a temperature of about 580° C., i.e., in the same temperature range, and, most preferably, at the same temperature, as that used in forming the Ti layer 24.

Figure 9A:
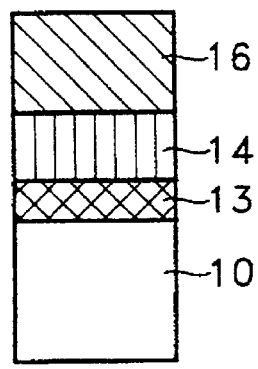
Figure 9B:
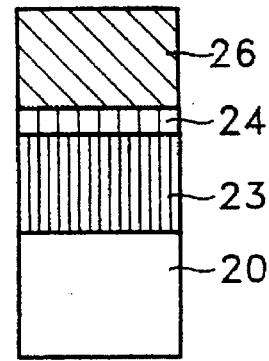

With reference now to FIG. 9B, which depicts the portion designated "e" in FIG. 6 in greater detail, it can be seen that the TiN layer 26 is formed on the Ti layer 24, which has a polycrystalline structure. This is in contrast to the conventional method, in which the TiN layer 16 is formed on the amorphous Ti layer 14 (FIG. 9A). Thus, the TiN layer 16 of the conventional method has a columnar, poor-quality grain structure, whereas the TiN layer 26 of the method of the present invention has a good-quality grain structure.

With particular reference now to FIG. 7, a metal, e.g., aluminum, is deposited on the diffusion barrier (TIN) layer 26, to thereby form a metal layer 28. Preferably, the silicon substrate 20 is moved into an aluminum deposition chamber under vacuum so as not to expose the diffusion barrier layer 26 to the ambient atmosphere. Alternatively, the Ti layer 24, the TiN layer 26, and the metal layer 28 can be successively formed in the same vacuum deposition chamber, preferably at the same temperature, e.g., 580° C., without breaking the vacuum. The aluminum is preferably deposited at a temperature in the range of 500°-800° C., to thereby enable the aluminum to fill the contact hole without the need for an additional reflow step, such as is required by the conventional method.

Figure 10A:
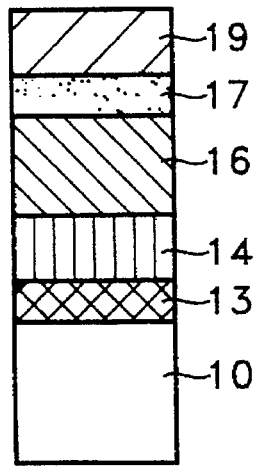
Figure 10B:
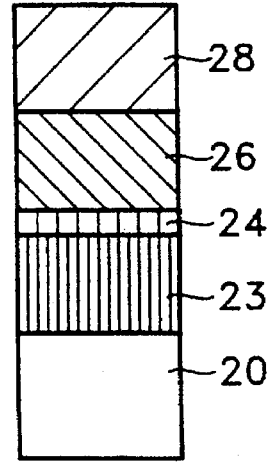

With reference now to FIG. 10B, which depicts the portion designated "f" in FIG. 7 in greater detail, it can be seen that the metal layer 28 is formed directly on the TiN layer 26, and not on an intervening TiON layer 17, as in the conventional method (FIG. 10A), thereby decreasing the contact resistance relative to the conventional method, and enabling a higher quality aluminum (metal layer) grain structure than can be achieved with the conventional method. This is because with the method of the present invention, the TiN layer 26 is not exposed to the ambient atmosphere, and thus, is not oxidized. Further, since the aluminum (metal layer) is deposited at a high temperature with the method of the present invention, the manufacturing process is simplified relative to the conventional method, which requires an additional reflow step, as previously mentioned.

However, forming the Ti and TiN layers 24 and 26, respectively, at a high temperature is virtually impossible to do with any presently available sputtering apparatus. Generally, a gas (e.g., Ar gas) heat conduction process for heating the semiconductor wafer is utilized, in which the rear surface of the wafer is heated by a stream of heated gas. In this connection, this conventional sputtering method suffers from a number of drawbacks and shortcomings. First, since the wafer is heated indirectly, it is impossible to heat the wafer to a temperature of greater than 650° C. In fact, due to equipment limitations, as a practical matter, the wafer can not be heated to a temperature of greater than 500° C. Second, the speed at which the wafer can be heated up to a target temperature, or cooled down to a target temperature, (i.e., the "ramping speed") is slow, thereby unduly decreasing the manufacturing throughput rate, and degrading the metal layer characteristics. Third, argon atoms are trapped in the metal layer, further degrading the metal layer characteristics.

An alternative wafer heating method utilizes a halogen lamp. However, this method results in an uneven heating of the wafer, and concomitant thermal nonuniformities throughout the wafer.

Figure 11:
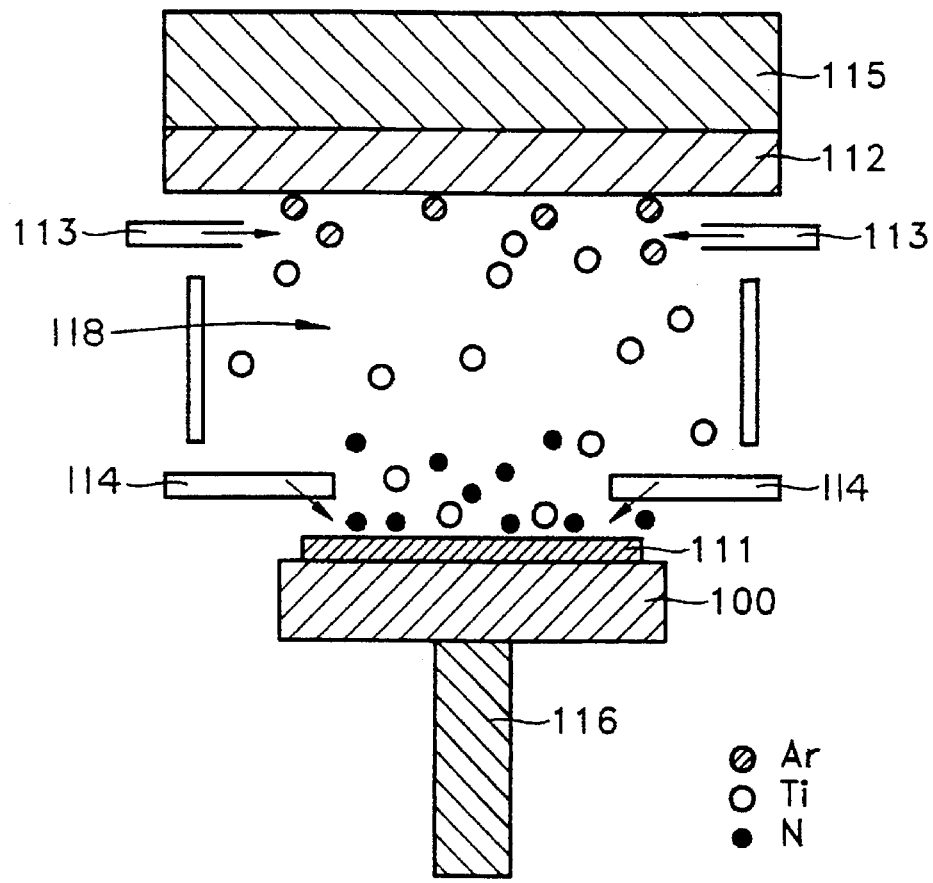
FIG. 11 is a schematic diagram of a sputtering apparatus constructed in accordance with a preferred embodiment of the present invention; and, FIG. 12 is a schematic diagram of a reactive gas injector constructed in accordance with a preferred embodiment of the present invention.

With reference now to FIG. 11, a sputtering apparatus constructed in accordance with a preferred embodiment of the present invention will now be described. More particularly, the sputtering apparatus depicted in FIG. 11 includes a silicon carbide chuck 100 for supporting a wafer 111, a target 112 made of a sputterable source material, e.g., titanium, an inert gas injector 113 for injecting an inert gas into the vacuum sputtering chamber 118, a reactive gas injector 114 for injecting a reactive sputtering gas, e.g., nitrogen, into the vacuum sputtering chamber 118, a cathode (first electrode) 115 affixed to the titanium target 112, and an anode (second electrode) 116 affixed to the silicon carbide chuck 100.

In operation, the sputtering apparatus depicted in FIG. 11 works as follows. More particularly, the wafer 111 is mounted on the silicon carbide chuck 100 and heated to a uniform high temperature, e.g., 580° C., e.g., by heating the chuck 100 to an appropriate temperature, or by heating both the wafer 111 and the chuck 100 simultaneously. In any event, because the chuck 100 is made of silicon carbide, it can maintain the wafer 111 at the desired temperature, with little deviation. Next, an inert (chemically inactive) gas, e.g., Ar, is injected into the vacuum sputtering chamber 118 by the inert gas injector 113, and a high voltage is applied across the first and second electrodes 115 and 116, to thereby ionize the injected argon (Ar) gas. The ionized argon gas glows and the discharged Ar$^+$ ions are attracted to the cathode 115, whereby they collide with the titanium target 112, thereby releasing titanium from the titanium target 112 into the vacuum sputtering chamber 118. The discharged titanium is attracted to the anode 116, and reacts with the nitrogen injected by the reactive sputtering gas injector 114, whereby a titanium nitride (TiN) layer is sputtered on the surface of the wafer 111.

Because the silicon carbide chuck 100 enables the wafer 111 to be heated directly in the vacuum sputtering chamber 118, before injecting the argon gas, it can be heated to a high, uniform temperature throughout the wafer 111, e.g., the wafer 111 can be heated to a temperature of about 1,200° with a ±3° C. deviation, thereby alleviating the problem of thermal nonuniformities associated with the argon conduction heating method. Second, with a direct heating method, the temperature of the wafer 111 can be rapidly ramped up or down, thereby enabling an increase in the manufacturing throughput rate compared with the conventional technology. For example, up-ramping speeds of 200°–300° C. per second and down-ramping speeds of 50°–100° C. per second are readily attainable. Third, since Ar gas is not used to heat the wafer 111, the amount of Ar atoms trapped in the deposited layer can be considerably reduced, thereby improving the quality thereof, relative to the conventional technology.

Additionally, the sputtering apparatus of the present invention preferably further includes a pre-processing or load-lock chamber (not shown) equipped with a halogen lamp (not shown), so that the wafer 111 can be moved into and out of the vacuum sputtering chamber 118 without impairing the integrity of the vacuum, and, the surface of the wafer 111 can be instantaneously heated by the halogen lamp to remove any moisture from the surface of the wafer 111 prior to sputtering.

Figure 12:
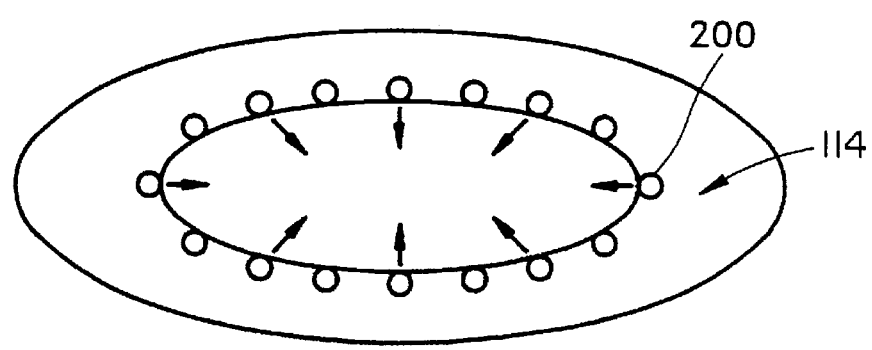

Further, with additional reference now to FIG. 12, in accordance with the present invention, the reactive gas injector 114 is preferably of annular shape, and provided with a plurality of orifices 200, the size (diameter) and angle of which can be adjusted in such a manner as to optimize the uniformity of the thickness and composition of the sputtered TiN layer. By contrast, the conventional technology utilizes a tubular reactive gas injector which injects the reactive gas horizontally across the surface of the wafer, with the result that the gas is not distributed uniformly over the surface of the wafer, thereby resulting in nonuniformities of the thickness and composition of the sputtered TiN layer.

Although a preferred embodiment of both the method and apparatus of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A sputtering method, comprising the steps of:
   employing a sputtering process carried out at a temperature of 500° C.–800° C. to form a titanium layer on a base layer comprising a silicon substrate, whereby a polycrystalline TiSi$_x$ layer is formed between said silicon substrate and said titanium layer; and,
   employing a sputtering process carried out at a temperature of 500° C.–800° C. to form a titanium nitride layer on said titanium layer.

2. The method as set forth in claim 1, wherein both employing steps are performed in a vacuum sputtering chamber, without breaking the vacuum of said chamber.

3. The method as in claim 2, wherein said temperatures are in the range of approximately 500° C.–640° C.

4. The method as in claim 2, wherein said temperatures are in the range of approximately 560° C.–600° C.

5. The method as set forth in claim 1, further comprising the step of forming a metal layer on said titanium nitride layer without exposing said titanium nitride layer to an ambient atmosphere.

6. The method as set forth in claim 5, wherein said metal layer is comprised of aluminum.

7. The method as in claim 6, wherein said temperatures are in the range of approximately 500° C.–640° C.

8. The method as in claim 6, wherein said temperatures are in the range of approximately 560° C.–600° C.

9. The method as set forth in claim 1, wherein both employing steps are carried out at the same temperature.

10. The method as set forth in claim 1, wherein:
    said base layer further comprises an insulating layer formed on said silicon substrate, said insulating layer having a contact hole formed therein to expose a portion of said silicon substrate; and
    said titanium layer is formed on said exposed portion of said silicon substrate and said insulating layer, whereby a polycrystalline TiSix layer is formed between said silicon substrate and said titanium layer.

11. The method as set forth in claim 10, further comprising the step of forming a metal layer on said titanium nitride layer, said metal layer filling said contact hole.

12. The method as set forth in claim 11, wherein the step of forming a metal layer is carried out in a vacuum deposition chamber without exposing said titanium nitride to an ambient atmosphere.

13. The method as set forth in claim 11, wherein both employing steps and the step of forming a metal layer are performed in a deposition chamber under vacuum, without breaking the vacuum.

14. The method as set forth in claim 13, wherein said metal layer is comprised of aluminum, and the step of forming a metal layer is carried out at a temperature of 500° C.–800° C.

15. The method as set forth in claim 14, wherein both employing steps and the step of forming a metal layer are carried out at the same temperature.

16. The method as in claim 13, wherein said temperatures are in the range of approximately 500° C.–640° C.

17. The method as in clam 13, wherein said temperatures are in the range of approximately 560° C.–600° C.

18. The method as in claim 10, wherein said temperatures are in the range of approximately 500° C.–640° C.

19. The method as in claim 10, wherein said temperatures are in the range of approximately 560° C.–600° C.

\* \* \* \* \*